(12) United States Patent
Starr et al.

(10) Patent No.: US 8,072,260 B1
(45) Date of Patent: **\*Dec. 6, 2011**

(54) CONFIGURABLE CLOCK NETWORK FOR PROGRAMMABLE LOGIC DEVICE

(75) Inventors: Gregory Starr, San Jose, CA (US);
Kang Wei Lai, Milpitas, CA (US);
Richard Y. Chang, Bloomfield, NJ (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/951,486

(22) Filed: Nov. 22, 2010

Related U.S. Application Data (60) Continuation of application No. 12/625,718, filed on Nov. 25, 2009, now Pat. No. 7,859,329, which is a division of application No. 11/888,336, filed on Jul. 30, 2007, now Pat. No. 7,646,237, which is a continuation of application No. 11/282,876, filed on Nov. 17, 2005, now Pat. No. 7,286,007, which is a continuation of application No. 10/830,562, filed on Apr. 22, 2004, now Pat. No. 7,075,365.

(51) Int. Cl.
*H01L 25/00* (2006.01)
(52) U.S. Cl. .................................. 327/565; 327/297
(58) Field of Classification Search .................. None
See application file for complete search history.

(56) References Cited

U.S. PATENT DOCUMENTS

| | | | |
|---|---|---|---|
| 3,473,160 A | 10/1969 | Wahlstrom | |
| 3,997,874 A | 12/1976 | Kelly et al. | |
| 4,494,021 A | 1/1985 | Bell et al. | |
| 4,542,509 A | 9/1985 | Buchanan et al. | |
| 4,633,488 A | 12/1986 | Shaw | |
| 4,658,152 A | 4/1987 | Walters | |
| 4,719,593 A | 1/1988 | Threewitt et al. | |
| 4,857,866 A | 8/1989 | Tateishi | |

(Continued)

FOREIGN PATENT DOCUMENTS

EP 0 266 065 5/1988

(Continued)

OTHER PUBLICATIONS

Advanced Micro Devices, Inc., "Am2971 Programmable Event Generator (PEG)," Publication No. 05280, Rev. C, Amendment /0, pp. 4-286-4-303 (Jul. 1986).

(Continued)

*Primary Examiner* — Cassandra Cox
(74) *Attorney, Agent, or Firm* — Ropes & Gray LLP; Jeffrey H. Ingerman (57) ABSTRACT

In a programmable logic device having high-speed serial interface channels, a clock distribution network for providing one or more high-speed clocks to dynamic phase alignment circuitry of those high-speed serial interfaces includes at least one bus that is segmentable (e.g. using tristatable buffers). This allows the bus to be divided into different portions that can be connected to different clock sources when the high-speed serial interfaces are running at different speeds. In one embodiment, the segmenting elements (e.g., the aforementioned buffers) are located between selected channels (e.g., every fourth channel), limiting the size of the different segments. In another embodiment, segmenting elements are located between each channel, allowing complete user freedom in selecting the sizes of the segments. Thus, instead of providing a bus for every clock source, multiple clocks can be made available to different channels by segmenting a single bus.

20 Claims, 5 Drawing Sheets

U.S. PATENT DOCUMENTS

| | | | |
|---|---|---|---|
| 4,868,522 A | 9/1989 | Popat et al. | |
| 4,959,646 A | 9/1990 | Podkowa et al. | |
| 5,072,195 A | 12/1991 | Graham et al. | |
| 5,075,575 A | 12/1991 | Shizukuishi et al. | |
| 5,079,519 A | 1/1992 | Ashby et al. | |
| 5,121,014 A | 6/1992 | Huang | |
| 5,133,064 A | 7/1992 | Hotta et al. | |
| 5,204,555 A | 4/1993 | Graham et al. | |
| 5,208,557 A | 5/1993 | Kersh | |
| 5,239,213 A | 8/1993 | Norman et al. | |
| 5,349,544 A | 9/1994 | Wright et al. | |
| 5,394,116 A | 2/1995 | Kasturia | |
| 5,397,943 A | 3/1995 | West et al. | |
| 5,418,499 A | 5/1995 | Nakao | |
| 5,420,544 A | 5/1995 | Ishibashi | |
| 5,424,687 A | 6/1995 | Fukuda | |
| 5,448,191 A | 9/1995 | Meyer | |
| 5,477,182 A | 12/1995 | Huizer | |
| 5,506,878 A | 4/1996 | Chiang | |
| 5,535,240 A | 7/1996 | Carney et al. | |
| 5,542,083 A | 7/1996 | Hotta et al. | |
| 5,581,214 A | 12/1996 | Iga | |
| 5,586,307 A | 12/1996 | Wong et al. | |
| 5,629,651 A | 5/1997 | Mizuni | |
| 5,642,082 A | 6/1997 | Jefferson | |
| 5,646,564 A | 7/1997 | Erickson et al. | |
| 5,656,959 A | 8/1997 | Chang et al. | |
| 5,691,669 A | 11/1997 | Tsai et al. | |
| 5,699,020 A | 12/1997 | Jefferson | |
| 5,742,180 A | 4/1998 | DeHon et al. | |
| 5,744,991 A | 4/1998 | Jefferson et al. | |
| RE35,797 E | 5/1998 | Graham et al. | |
| 5,777,360 A | 7/1998 | Rostoker et al. | |
| 5,815,016 A | 9/1998 | Erickson | |
| 5,847,617 A | 12/1998 | Reddy et al. | |
| 5,852,728 A | 12/1998 | Matsuda et al. | |
| 5,889,436 A | 3/1999 | Yeung et al. | |
| 5,900,757 A | 5/1999 | Aggarwal et al. | |
| 5,952,891 A | 9/1999 | Boudry | |
| 5,963,069 A | 10/1999 | Jefferson et al. | |
| 5,970,110 A | 10/1999 | Li | |
| 5,974,105 A | 10/1999 | Wang et al. | |
| 5,987,543 A | 11/1999 | Smith | |
| 5,999,025 A | 12/1999 | New | |
| 6,014,048 A | 1/2000 | Talaga, Jr. et al. | |
| 6,020,931 A | 2/2000 | Bilbrey et al. | |
| 6,043,677 A | 3/2000 | Albu et al. | |
| 6,058,117 A | 5/2000 | Ennamarato et al. | |
| 6,069,506 A | 5/2000 | Miller | |
| 6,069,507 A | 5/2000 | Shen et al. | |
| 6,072,348 A | 6/2000 | New et al. | |
| 6,081,022 A | 6/2000 | Mitra et al. | |
| 6,104,222 A | 8/2000 | Embree | |
| 6,107,946 A | 8/2000 | Jeong | |
| 6,114,915 A | 9/2000 | Huang et al. | |
| 6,125,217 A | 9/2000 | Paniccia et al. | |
| 6,125,421 A | 9/2000 | Roy | |
| 6,127,865 A | 10/2000 | Jefferson | |
| 6,141,394 A | 10/2000 | Linebarger et al. | |
| 6,144,224 A | 11/2000 | Lee et al. | |
| 6,144,242 A | 11/2000 | Jeong et al. | |
| 6,144,675 A | 11/2000 | Wakabayashi et al. | |
| 6,157,266 A | 12/2000 | Tsai et al. | |
| 6,188,699 B1 | 2/2001 | Lang et al. | |
| 6,195,758 B1 | 2/2001 | Lundh et al. | |
| 6,229,861 B1 | 5/2001 | Young | |
| 6,249,189 B1 | 6/2001 | Wu et al. | |
| 6,252,419 B1 | 6/2001 | Sung et al. | |
| 6,278,332 B1 | 8/2001 | Nelson et al. | |
| 6,311,313 B1 | 10/2001 | Camporese et al. | |
| 6,320,469 B1 | 11/2001 | Friedberg et al. | |
| 6,326,812 B1 | 12/2001 | Jefferson | |
| 6,359,483 B1 | 3/2002 | Watkins et al. | |
| 6,369,624 B1 | 4/2002 | Wang et al. | |
| 6,373,278 B1 | 4/2002 | Sung et al. | |
| 6,411,150 B1 | 6/2002 | Williams | |
| 6,462,623 B1 | 10/2002 | Horan et al. | |
| 6,463,547 B1 | 10/2002 | Bailey et al. | |
| 6,483,886 B1 | 11/2002 | Sung et al. | |
| 6,504,415 B1 | 1/2003 | Robinson et al. | |
| 6,650,161 B2 | 11/2003 | Thomas et al. | |
| 6,690,195 B1 | 2/2004 | Ngai et al. | |
| 6,730,540 B2 | 5/2004 | Siniaguine | |
| 6,836,877 B1 | 12/2004 | Dupenloup | |
| 6,862,548 B1 | 3/2005 | Chan | |
| 6,924,678 B2 | 8/2005 | Starr | |
| 7,075,365 B1 | 7/2006 | Starr et al. | |
| 7,242,229 B1 | 7/2007 | Starr et al. | |
| 7,286,007 B1 * | 10/2007 | Starr et al. | 327/565 |
| 7,304,507 B1 | 12/2007 | Tran et al. | |
| 7,646,237 B1 * | 1/2010 | Starr et al. | 327/565 |
| 7,859,329 B1 * | 12/2010 | Starr et al. | 327/565 |
| 2001/0033188 A1 | 10/2001 | Aung et al. | |
| 2005/0080580 A1 | 4/2005 | Kantake | |
| 2007/0018863 A1 | 1/2007 | Hoang et al. | |

FOREIGN PATENT DOCUMENTS

| | | |
|---|---|---|
| EP | 0 416 930 | 3/1991 |
| EP | 0 501 652 | 9/1992 |
| EP | 0 657 797 A2 | 6/1995 |
| EP | 0 778 517 | 6/1997 |
| EP | 0 903 660 | 3/1999 |
| EP | 0 987 822 | 3/2000 |
| EP | 1 056 207 | 11/2000 |
| EP | 0 657 797 B1 | 7/2003 |
| JP | 1-137646 | 5/1989 |
| JP | 10215156 | 8/1998 |
| WO | WO 91/10951 | 7/1991 |

OTHER PUBLICATIONS

Advanced Micro Devices, Inc., "AmPAL*23S8 20-Pin IMOX PAL-Based Sequencer," Publication No. 06207, Rev. B, Amendment /0, pp. 4-102-4-121 (Oct. 1986).

Agere Systems, Inc., "ORCA ORT82G5 0.622/1.0-1.25/2.0-2.5/3.125 Gbits/s Backplane Interface FPSC," Preliminary Data Sheet, pp. 1-35 (Jul. 2001).

Agere Systems, Inc., "ORCA 8850 Field-Programmable System Chip (FPSC) Eight Channel x850 Mbits/s Backplane Transceiver," Product Brief, pp. 1-6 (Jul. 2001).

Agere Systems, Inc., "ORCA 8850 Field-Programmable System Chip (FPSC) Eight Channel x850 Mbits/s Backplane Transceiver," Product Brief, pp. 1-36 (Aug. 2001).

Avrionova, K., "Applications and Performance of PTN1111 and PTN2111 Clock Distribution Devices," Application Note AN259, Philips Semiconductors, Oct. 16, 2001, pp. 1-6.

Blair, G.M., "Self Generating Clock Using an Augmented Distribution Network," IEE Proc. Circuits Devices Syst., vol. 144, No. 4, Aug. 1997, pp. 219-222.

Chen, Y., et al., "The Associative-Skew Clock Routing Problem," 1999 IEEE/ACM International Conference on Computer-Aided Design; Digest of Technical Papers, Nov. 7-11, 1999, pp. 168-172.

Debaes, C., et al., "Receiver-Less Optical Clock Injection for Clock Distribution Networks," IEEE Journal of Selected Topics in Quantum Electronics, vol. 9, No. 2, Mar./Apr. 2003, pp. 400-409.

DynaChip Corp., "Application Note: Using Phase Locked Loops in DL6035 Devices" (1998).

DynaChip Corp., DY6000 Family Datasheet (Dec. 1998).

Friedman, E.G., "Clock Distribution Networks in Synchronous Digital Integrated Circuits," Proceedings of the IEEE, vol. 89, No. 5, May 2001, pp. 665-692.

Katrai, C., "Managing Clock Distribution and Optimizing Clock Skew in Networking Applications," Application Note 14, Pericom Semiconductor Corporation, San Jose, California, Dec. 29, 1998, pp. 71-78.

Ko, U., et al., "A 30-ps Jitter, 3.6 μs Locking, 3.3-Volt Digital PLL for CMOS Gate Arrays," Proceedings of the IEEE 1993 Custom Integrated Circuits Conference, Publication No. 0-7803-0826-3/93, pp. 23.3.1-23.3.4 (May 9-12, 1993).

LSI Logic Corp., 500K Technology Design Manual (Document DB04-000062-00, First Edition), pp. 8-1-8-33 (Dec. 1996).

Lucent Technologies, Inc., Optimized Reconfigurable Cell Array (ORCA®) OR3Cxxx/OR3Txxx Series Field-Programmable Gate Arrays, Preliminary Product Brief, (Nov. 1997).

Lucent Technologies, Inc., ORCA® Series 3 Field-Programmable Gate Arrays, Preliminary Data Sheet, Rev. 01 (Aug. 1998).

Monolithic Memories, Inc., "Programmable Array Logic PAL20RA10-20 Advance Information," pp. 5-95-5-102 (Jan. 1988).

National Semiconductor Corp., LVDS Owner's Manual & Design Guide (Apr. 25, 1997).

National Semiconductor Corp., "DS90CR285/DS90CR286 +3.3V Rising Edge Data Strobe LVDS 28-Bit Channel Link-66 MHZ," (Mar. 1998).

Pearson, T., "ECL Clock Distribution Techniques," ECL Applications Engineering, Semiconductor Components Industries, LLC, Publication Order No. AN1405/D, May 2000-Rev. 2, pp. 1-8.

Xilinx, Inc., Virtex 2.5V Field Programmable Gate Arrays Advance Product Specification (Version 1.0) (Oct. 20, 1998).

Xilinx, Inc., Application Note: Using the Virtex Delay-Locked Loop (Version 1.31) (Oct. 21, 1998).

Zaks, R., et al., From Chips to Systems: An Introduction to Microcomputers, pp. 54-61 (Prentice-Hall, Inc., Englewood Cliffs, N.J., 1987).

\* cited by examiner

CONFIGURABLE CLOCK NETWORK FOR PROGRAMMABLE LOGIC DEVICE

This is a continuation of commonly-assigned U.S. patent application Ser. No. 12/625,718, filed Nov. 25, 2009, now U.S. Pat. No. 7,859,329, which is a division of commonly-assigned U.S. patent application Ser. No. 11/888,336, filed Jul. 30, 2007, now U.S. Pat. No. 7,646,237, which is a continuation of commonly-assigned U.S. patent application Ser. No. 11/282,876, filed Nov. 17, 2005, now U.S. Pat. No. 7,286,007, which is a continuation of commonly-assigned U.S. patent application Ser. No. 10/830,562, filed Apr. 22, 2004, now U.S. Pat. No. 7,075,365, each of which is hereby incorporated herein in its respective entirety.

BACKGROUND OF THE INVENTION

This invention relates to a configurable clock network for a programmable logic device. More particularly, this invention relates to a clock network that allows each of several clocks to be configurably routed to different portions of a programmable logic device.

High-speed serial signaling is becoming an increasingly important form of signaling between electronic devices. For example, Low Voltage Differential Signaling ("LVDS") has become a common form of signaling. Typically the data represent bytes of information that are being transmitted one after another. The usual definition of a byte is eight bits, but as used herein "byte" can refer to any plural number of bits such as eight bits, nine bits, ten bits, eleven bits, or fewer or more than these numbers of bits. When the data are received, one task that the receiving circuitry must typically perform is to find the boundaries between the successive bytes in the received serial bit stream. This may be referred to as "byte alignment" or "byte synchronization".

In order to accommodate the use of high-speed serial signaling, electronic devices using such signaling must provide accurate high-speed clocks, which typically are provided using a loop circuit—i.e., a phase-locked loop ("PLL") or a delay-locked loop ("DLL"). Typically, there is more than one high-speed serial channel on each device, and just as typically each loop circuit supplies the clock for more than one channel. The clock is used for serialization/deserialization, as well as for the above-described byte alignment process. Because of skew across the channels, the clock may be provided in a number of equally-distributed phases (i.e., each phase separated from its neighbors by the same phase angle—e.g., 45° of phase in the case of eight clock phases), and dynamic phase alignment ("DPA") circuitry may be provided in each channel to select the correct phase of the clock to account for skew and keep the data properly aligned with the clock, particularly in the byte alignment portion of each channel's serial data interface.

Programmable logic devices ("PLDs") are well known as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, a PLD is a general-purpose integrated circuit device that is programmable to perform any of a wide range of logic tasks. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

It is known to use high-speed serial signaling with PLDs. PLDs designed for use with high-speed serial signaling typically include, in their input/output circuitry, programmable interfaces that can be used with one or more high-speed serial protocols, with the ability to programmably select the portions of the circuitry for a particular protocol. Similarly, multiple high-speed clock sources could be provided on the PLD, so that different ones of the programmable interfaces could operate at different clock speeds. However, heretofore the flexibility to assign a particular clock source to a particular channel was limited. For example, in one implementation, each channel is assigned to a particular clock source; in such a case, while different clock speeds are available, the user is constrained as to which channels can be used at which speeds. In another implementation, a plurality of clock buses could be provided to make each clock source available to each channel, with suitable multiplexing provided to connect each channel to the desired clock bus. The latter implementation requires a number of clock buses equal to the number of clock sources, as well as a plurality of—e.g., eight—multiplexers (each clock signal actually may be eight signals as described above) per channel per bus, imposing a high chip area cost. This latter implementation also has a high power cost unless provision is made to power down unused buses, and in some user implementations there may not be any unused buses—if even one channel uses a particular clock source, then the entire bus for that clock source must be powered up.

It would be desirable to be able to provide a programmable logic device having a clock network that allows the distribution of a plurality of clocks to a plurality of serial data channels without excessive area or power cost.

SUMMARY OF THE INVENTION

The present invention allows the distribution of a plurality of clocks to serial data channels without excessive area or power cost by providing a segmented clock bus to which all of the available clocks may be connected. Different segments of the bus may be connectable to different clocks, or the entire bus may be connected to one clock.

Thus, if more than one clock is being provided, then as long as each serial data channel is located near a segment on which the particular clock that it requires is provided, all channels can receive the correct clocks. Because only one bus is used, it is not necessary to consume area or power with multiple buses, although some additional circuitry will be required to achieve the bus segmentation and to allow the various clocks to be selectively connected to the bus. Although the user may be constrained when programming the device to place all channels requiring a particular clock near one another—or, more particularly, near the segment of the bus carrying that particular clock—the user has much greater flexibility in deciding which channels will use which clocks than in an arrangement where groups of channels are dedicated to particular clocks. And although the user may have less flexibility than in an implementation where a separate bus if provided for each clock to allow any channel to access any bus, the present invention has much lower power and chip area costs than in such a multiple bus limitation.

In accordance with this invention, there is provided a clock distribution network for use in a programmable logic device where the programmable logic device has a first number of serial data channels, and a second number of clock sources. The clock distribution network includes a clock bus having a plurality of bus segments for distributing clock signals to those channels, with each channel being connected to one of the bus segments. At each junction between adjacent bus segments, there is a respective programmable connection between those adjacent bus segments. A number of controllable inputs are provided, with each of the controllable inputs selectably connecting one of the clock sources to one of the segments of the clock bus.

This arrangement allows the bus segments to be connected, or not connected, in such a way as to allow the desired number of different clock sources to be connected to a desired number of different bus segments. Thus, if a user wants to use only one clock for all channels, then the respective programmable connections can all be turned on, creating one continuous clock bus, and one of the controllable inputs can be used to connect that single continuous clock bus to the desired clock source. Alternatively, the respective programmable connections can be turned off to create a number of individual clock buses equal to the number of available clock sources, and suitable ones of the controllable inputs can be turned on the connect the respective individual clock sources to the respective clock bus segments.

It will be understood, that between those extreme cases, a user may elect to turn on only some of the programmable connections to create more than one clock bus, but fewer clock buses than the number of clock bus segments. It will further be understood that preferably the various individual clock sources will be placed near different ones of the bus segments so that, as to each clock source, it may be connected to the bus segment to which it is adjacent if that bus segment is not connected to other bus segments, but at the same time may be connected to a larger bus, including the bus segment to which it is adjacent (and which may include all, or fewer than all, of the available bus segments as described above).

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-4.

Figure 1:
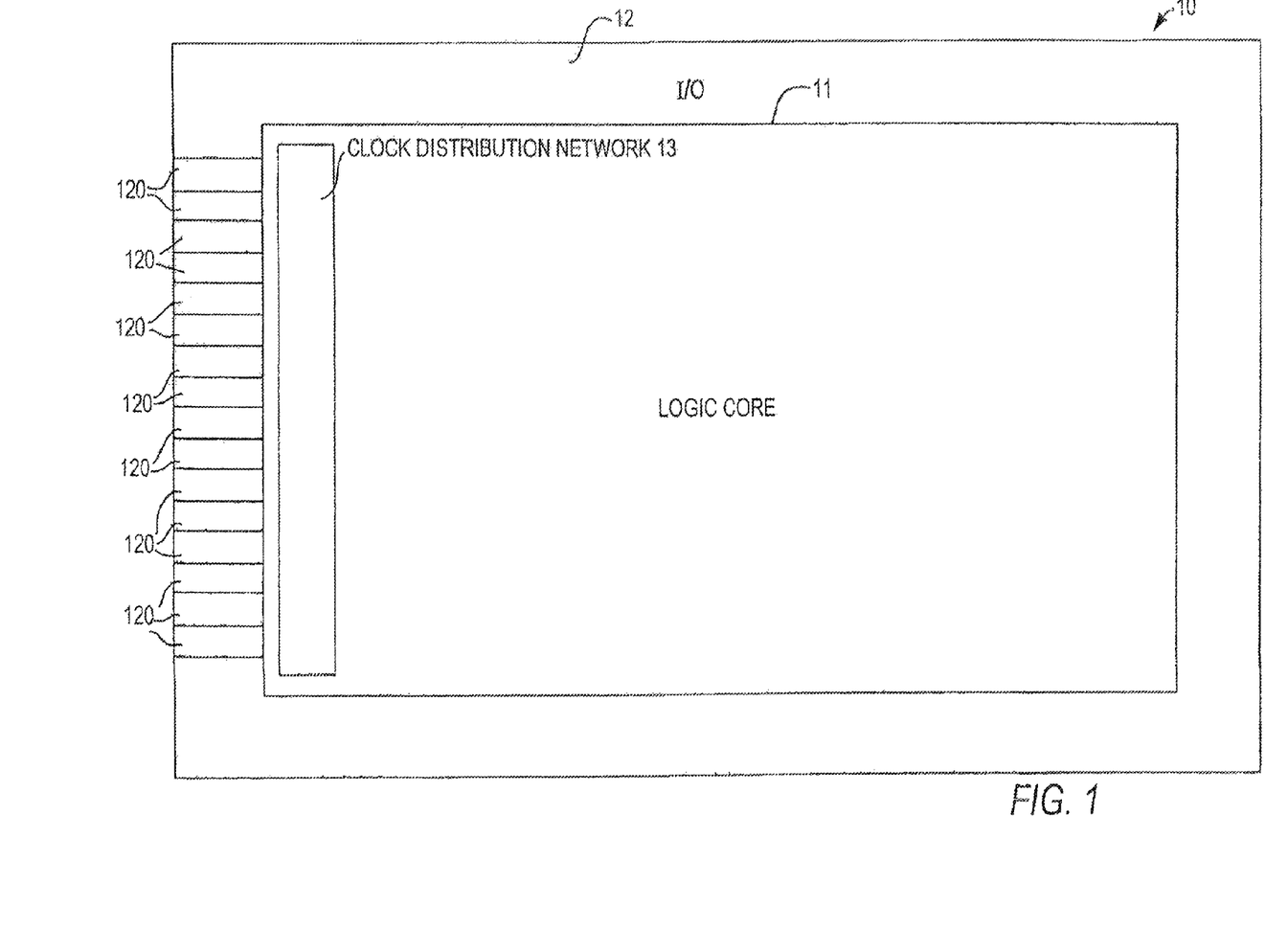
FIG. 1 is a schematic representation of a programmable logic device that may incorporate the present: invention.

FIG. 1 shows a representation of a PLD 10 that may incorporate the invention. PLD 10 includes a core logic area 11 which, as is well-known, may include look-up table-type logic or sum-of-products-type logic (i.e., product-term, or P-TERM, logic), as well as suitable interconnect structures as are well known. A region 12 of input/output circuitry preferably is provided along the edges of PLD 10, and preferably includes at least some high-speed serial input/output channels 120. For example, each of channels 120 may be designed as LVDS channels, or to be user-configurable as LVDS channels as well as other types of channels. It will be appreciated that to the extent that channels 120 are described herein, as an example, as LVDS channels, they may be any type of interface that requires a high-speed clock. PLD 10 preferably also includes a clock distribution network 13 in accordance with the present invention.

It should be noted that FIG. 1 is purely schematic. Thus, although high-speed serial input/output channels 120 are shown in only one portion of I/O region 12, and clock distribution network 13 is shown only adjacent that portion of I/O region 12, in practice high-speed serial input/output channels 120 may be provided in any portion of I/O region 12, and clock distribution network 13 may be placed adjacent anywhere it is needed to service any high-speed serial input/output channels that may be present.

Figure 2:
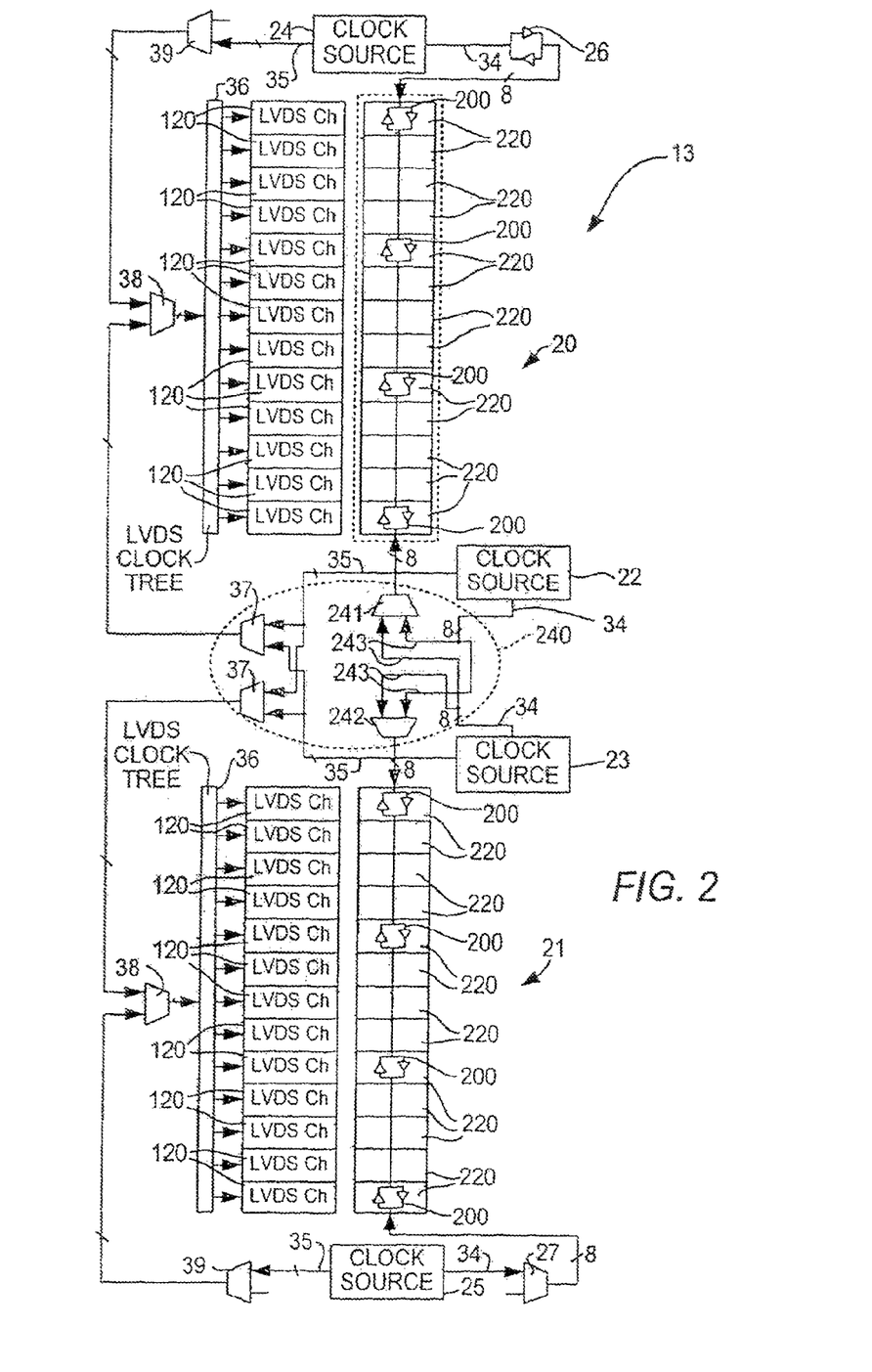
FIG. 2 is a schematic representation of a first embodiment of a clock distribution network in accordance with the present invention.

As seen in FIG. 2, clock distribution network 13 preferably includes a clock channel 220 corresponding to each input/output channel 120. In this particular embodiment, which is illustrative only, clock distribution network 13 is physically laid out as two separate portions 20, 21, with two high-speed clock sources 22, 23 located between portions 20, 21. An arrangement 240 of controllable inputs—in this example multiplexers 241, 242—allows either clock source 22, 23 to be connected to either portion 20, 21 of clock distribution network 13, including allowing either one of clock sources 22, 23 to be connected to both portions 20, 21 of clock distribution network 13.

The traces 243 shown in arrangement 240 are not to scale. Preferably, arrangement 240 is matched and balanced, so that each of the plurality of conductors (not shown) making up a trace 243 (to carry the multiple clock phases discussed above) is the same length, so that skew does not develop as among the various phases and they remain in their predetermined—preferably equiangular—phase relationship. It is not necessary that one of traces 243 connecting, e.g., clock source 22 to clock distribution network portion 20 be the same length as that one of traces 243 connecting that clock source to clock distribution network portion 21, as long as each of the conductors within each respective trace 243 is the same length as each other conductor in that respective trace. However, because it is possible that that clock source may be connected simultaneously to both clock distribution network portions 20, 21, the difference, if any, in length between that one of traces 243 connecting, e.g., clock source 22 to clock distribution network portion 20, and that one of traces 243 connecting, e.g., clock source 22 to clock distribution network portion 21, preferably should be equivalent to a multiple of the phase angle difference between adjacent phases of that clock, so that aligned with each clock phase available in clock distribution network portion 20 is a clock phase available in clock distribution network portion 21, even if it is not present on the corresponding conductor (the phase alignment circuitry in each input/output channel 120 will select the correct phase).

Preferably, in this embodiment there are also two additional clock sources 24, 25 located at the respective opposite ends of clock distribution network portions 20, 21. Respective tristatable elements 26, 27 preferably are provided to isolate each respective clock source 24, 25 from respective clock distribution network portion 20, 21 if respective clock source 24, 25 is not being used. In FIG. 2, tristatable element 26 is shown as a tristatable buffer, while tristatable element 27 is shown as a tristatable multiplexer with clock source 25 connected to one input of that multiplexer and the other input of that multiplexer being unused.

Using multiplexers instead of tristatable buffers for this purpose would be particularly advantageous, as long as the multiplexer is tristatable, when still other additional clock sources (not shown) are provided, to provide an option to connect one of those additional clock sources to respective clock distribution network portion 20, 21 in place of clock 24, 25, in which case the additional multiplexer inputs would be connected to the additional clock sources. It will be understood that while in FIG. 2 (and FIG. 3, below), tristatable element 26 is shown as a tristatable buffer, while tristatable element 27 is shown as a tristatable multiplexer, any combination may be used, such that tristatable element 26 could be a tristatable multiplexer while tristatable element 27 could be a tristatable buffer, or elements 26, 27 could both be tristatable buffers or could both be tristatable multiplexers.

In the embodiment shown in FIG. 2, a tristatable buffer 200 is provided at every fourth channel 220. Although each tristatable buffer 200 is shown within a respective channel 220, it should be considered to be located between the channel 220 in which it is drawn and the channel 220 below. According to this arrangement, by turning on all tristatable buffers 200 in a respective clock distribution network portion 20, 21, each channel 220 in that respective portion of clock distribution network 13 can be connected to the same clock source, which may be either of clock sources 22, 23, or may be a respective one of clock sources 24, 25 depending on whether one is considering clock distribution network portion 20 or 21. Alternatively, by turning off one of tristatable buffers 200 in one of clock distribution network portions 20, 21, that portion 20, 21 can be segmented into two clock buses, one of which may be connected to either of clock sources 22, 23, or to a respective one of clock sources 24, 25 depending on whether one is considering clock distribution network portion 20 or 21.

Because the tristatable buffers 200 are located at every fourth channel 220 in the embodiment shown in FIG. 2, if the user desires to segment either of clock distribution network portions 20, 21 into two clock buses, the user would be limited as to where those divisions could be made, and therefore as to how many of channels 220 could be assigned to each of those two clock buses. In the alternate embodiment 33 of FIG. 3, however, tristatable buffers 200 are located at each channel 220. Therefore, the user can segment each of clock network distribution portions 30, 31 at a point between any two channels, as may be desired.

Figure 3:
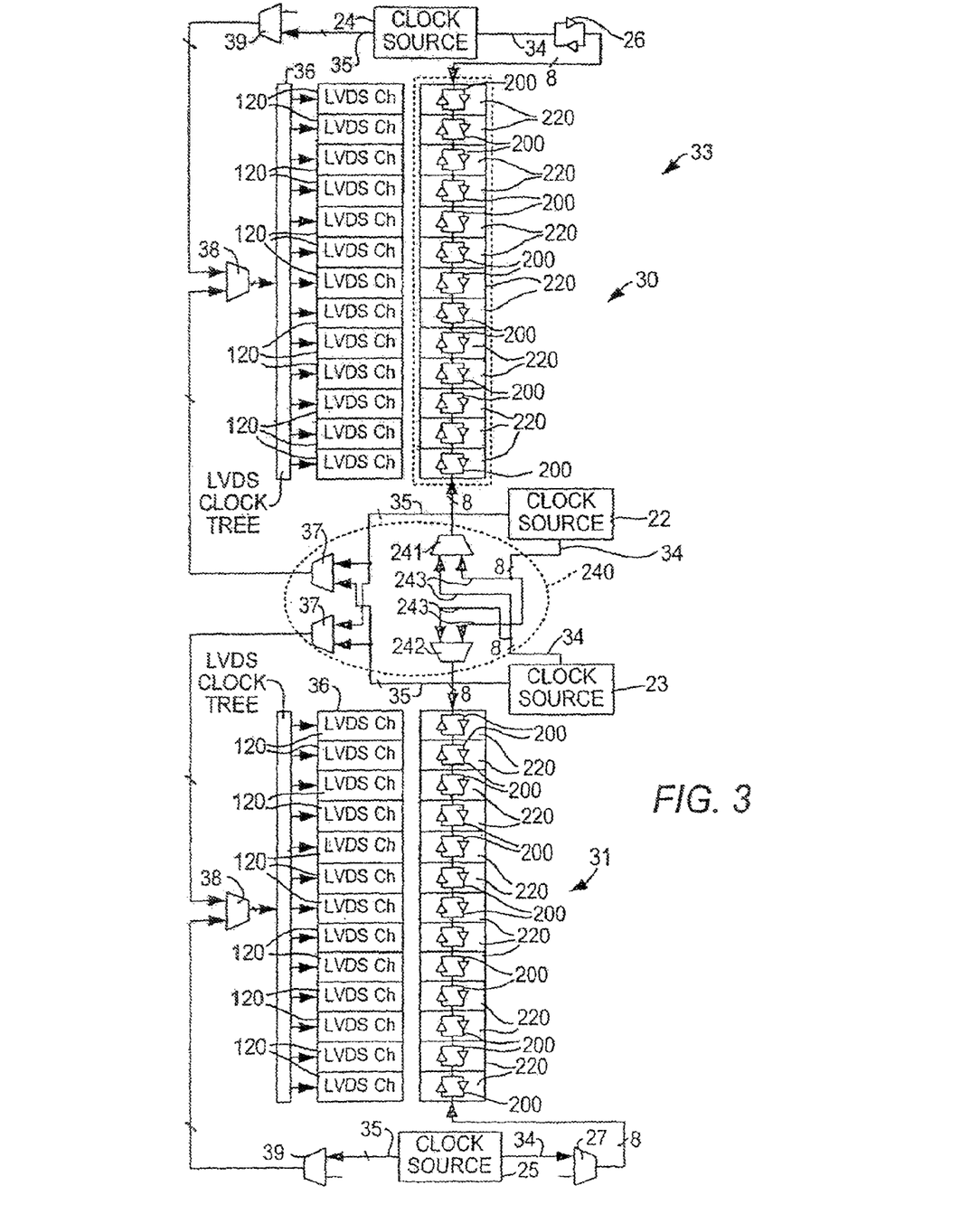
FIG. 3 is a schematic representation of an alternate implementation of the embodiment of FIG. 2.

It can be seen that in FIGS. 2 and 3 that in embodiments 13, 33, it may be possible in one configuration to have all channels 220 on a single clock bus connected to one of clock sources 22, 23. In a second configuration, it is possible to have all of clock distribution network portion 20, 30 be one clock bus connected to any one of clock sources 22, 23, 24, while also having clock distribution network portion 21, 31 be one clock bus connected to any one of clock sources 22, 23, 25. In a third configuration, while clock distribution network portion 20, 30 may be configured as a single clock bus connected to any of clock sources 22, 23, 24, clock distribution network portion 21, 31, can be segmented into two bus segments, with one segment connected to one of clock sources 22, 23, and the other segment connected to clock source 25. In a fourth configuration, while clock distribution network portion 21, 31 may be configured as a single clock bus connected to any of clock sources 22, 23, 25, clock distribution network portion 20, 30, can be segmented into two bus segments, with one segment connected to one of clock sources 22, 23, and the other segment connected to clock source 24. Finally, in a fifth configuration, each of clock distribution network portions 20, 30 and 21, 31 may be segmented into two bus segments, with one segment of clock distribution network portion 20, 30 connected to one of clock sources 22, 23, and the other segment connected to clock source 24, and with one segment of clock distribution network portion 21, 31 connected to one of clock sources 22, 23, and the other segment connected to clock source 25.

In the third, fourth and fifth configurations referred to in the previous paragraph, any segmentation of a clock distribution network portion 20, 21 would have to occur at the location one of the tristatable buffers 200. Thus, in embodiment 13, the smallest possible bus segment that could be created would be four channels long, either at the end closest to clock sources 22, 23, or at the end closest to a respective one of clock sources 24, 25, and the length of a bus segment would have to be a multiple of four channels (plus one additional channel in the segment closer to clock sources 22, 23). On the other hand, in those same configurations in embodiment 33, while segmentation of a clock distribution network portion 30, 31 still would have to occur at the location one of the tristatable buffers 200, those locations are at every channel 220. Therefore, the smallest possible bus segment that could be created would be one channel long. The location of that one-channel-long bus still would be limited to either the end closest to clock sources 22, 23, or the end closest to a respective one of clock sources 24, 25. However, the bus segments could be any length.

Tristatable buffers 200 may be any suitable tristatable bidirectional buffer, as are known to those of ordinary skill in the art. Preferably, each tristatable buffer 200 can be controlled or programmed to pass signals in either or both directions, or to block signals in both directions. It should be noted that in the embodiments of FIGS. 2 and 3, any one or more of channels 220 may be unused in a particular user design (e.g., for layout reasons). In such a case, the tristatable buffers 200 bracketing that channel (in FIG. 3) or bracketing a group of unused channels (in FIG. 2) can be left on to pass the clock to channels beyond the skipped channel or channels. Alternatively, if the channels on opposite sides of the skipped channel or channels are receiving different clocks from opposite ends of clock distribution network 13, 33, then the tristatable buffers 200 bracketing that channel (in FIG. 3) or bracketing the group of unused channels (in FIG. 2) preferably would be turned off so that no clock signals reach the skipped channel or channels.

In addition, it may be desirable to prevent the disconnected clock conductors in such a skipped zone from floating, and to force such conductors to a known state to prevent unnecessary power consumption. Therefore, each tristatable buffer 200 preferably includes circuitry (not shown) to connect a disconnected clock conductor to a fixed voltage supply. Such circuitry may be a simple transistor or passgate (not shown) that can be turned on when tristatable buffer 200 is tristated. In one embodiment, such a passgate would be provided on each end of tristatable buffer 200, so that regardless of which side of tristatable buffer 200 the disconnected clock conductor segment was on, that clock conductor segment could be driven to a known state. Alternatively, because the disconnected clock conductor segment would be bracketed by two tristatable buffers 200, the passgate could be provided at only one end of each tristatable buffer 200, as long as all tristatable buffers 200 would always be oriented in the same direction (e.g., always away from central clock sources 22, 23).

In FIGS. 2 and 3, each clock source 22, 23, 24, is shown having two outputs 34, 35. Output 34 is the eight-phase clock output discussed above and connected to clock distribution network 13, 33 which is used for dynamic phase alignment. However, the front end of each channel 120 also requires a high-speed bit-rate clock, as well as a corresponding byte-rate clock, for serialization/deserialization as is any known high-speed serial interface. Although not part of the present invention, those two clocks are represented by the second output 35 of each of clock sources 22, 23, 24, 25. Indeed, in a preferred embodiment, each output 35 may carry more than one bit-rate/byte-rate clock pair, plus a corresponding number of compensation signals. In the drawings, the hash marks on those outputs represent those multiple signals, as is conventional.

In the examples of FIGS. 2 and 3, each channel 220 is an LVDS interface, and the clocks 35 are distributed by LVDS clock trees 36 of known type, except that multiplexers 37, 38, 39, are provided to allow selection of the appropriate clock source. For example, each of LVDS clock trees 36 could include multiple parallel trees with a multiplexer (not shown) provided at the output to each channel 220. Note that each multiplexer 39 is shown with only one of its two inputs used. Multiplexer 39 could be used in such a configuration as a buffer (and could be replaced by a buffer (not shown)), or, as discussed above, additional clock sources (not shown) could be provided in addition to clock sources 24, 25, and the selection between one of those additional clock sources and a respective one of clock sources 24, 25 could be made by multiplexer 39.

Figure 4:
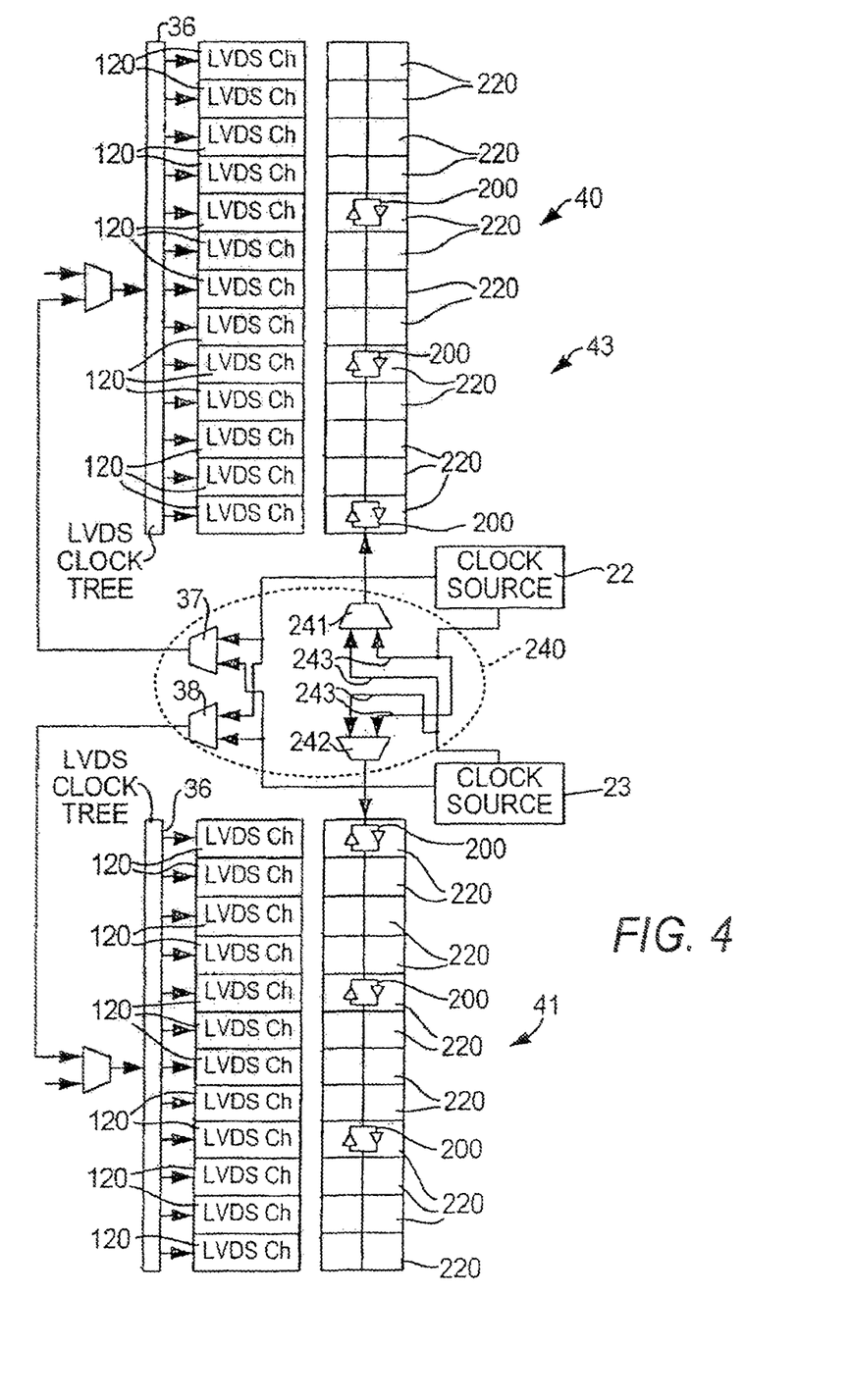
FIG. 4 is a schematic representation of a second embodiment of a clock distribution network in accordance with the present invention.

A simplified embodiment 43 of a clock distribution network in accordance with the present invention, having portions 40, 41 corresponding to portions 20, 21 or 30, 31, is shown in FIG. 4. This embodiment is similar to embodiment 13 in that tristatable buffers 200 are available only at every fourth channel 220, but a similarly simplified embodiment (not shown) based on embodiment 33 may also be provided. In this simplified embodiment, only clock sources 22, 23 are provided, along with controllable input arrangement 240 including multiplexers 241, 242 to connect those clock sources to clock distribution network portions 20, 21, are provided. Similarly, only multiplexers 37, 38 are needed to connect clock sources 22, 23 to LVDS clock trees 36. In this embodiment, it is multiplexers 38 that have one unused input and could be replaced by buffers.

As in the embodiments of FIGS. 2 and 3, above, in embodiment 43 of FIG. 4, a channel or group of channels could be skipped and the clock signal passed through to adjacent channels. However, in this embodiment, if any one of tristatable buffers 200 is tristated, then no channel beyond that point would receive clock signal. Thus, in this embodiment a tristatable buffer 200 would be tristated only when it is desired to skip all channels beyond that point. Preferably, in such a case, the circuitry (e.g., a passgate) discussed above would be used to force the unused clock conductors to a known state to prevent unnecessary power consumption.

Thus it can be seen that in accordance with the present invention, a single bus can be used to conduct multiple clock sources to different channels. Because each of these sources is actually, as discussed above, multiple (e.g., eight) phases of a single clock, the invention provides a significant savings in the number of bus conductors that must be provided (e.g., a savings of eight conductors multiplied by the number of clock sources beyond one source).

Figure 5:
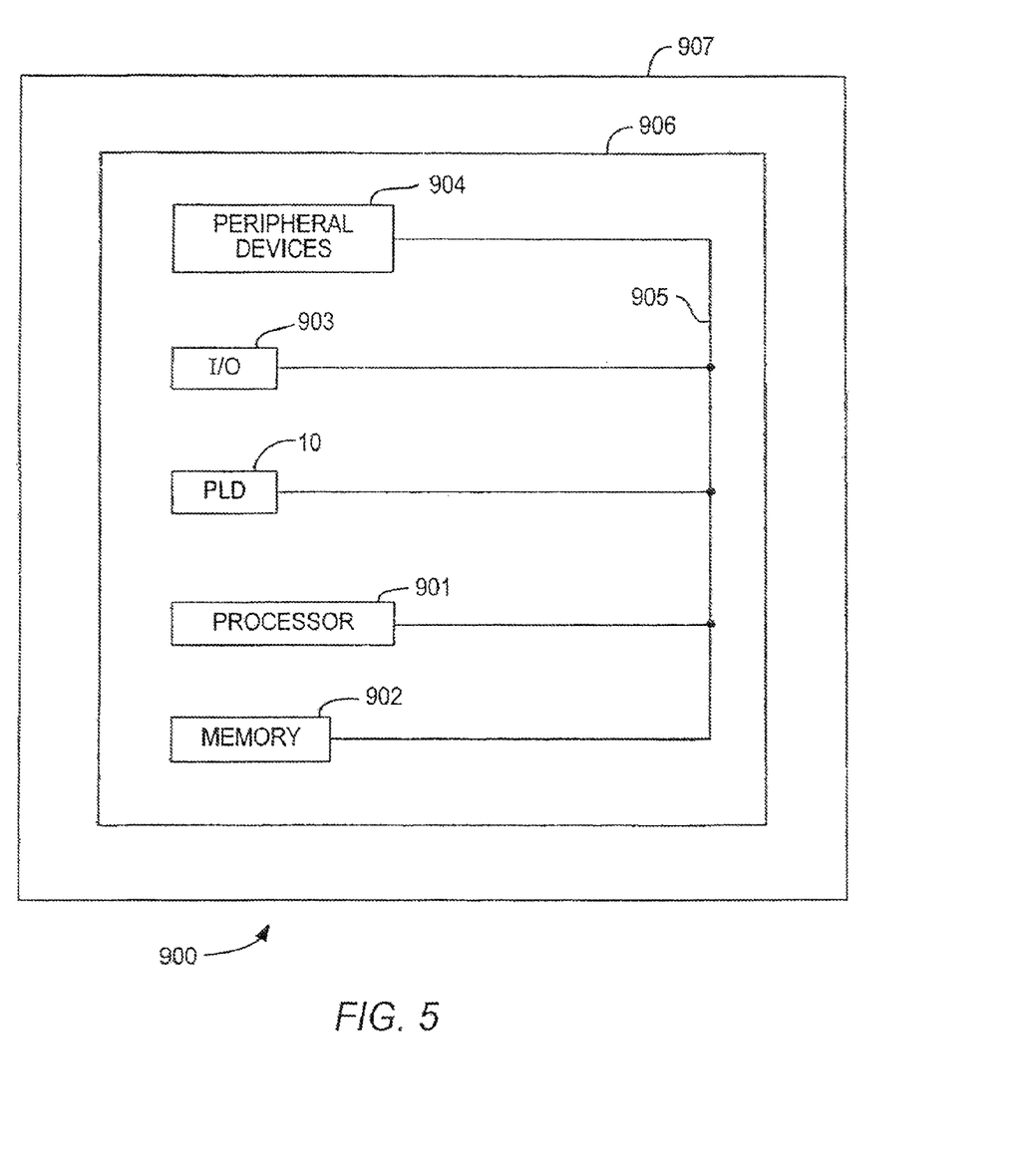
FIG. 5 is a simplified block diagram of an illustrative system employing a programmable logic device in accordance with the invention.

PLD 10 according to the present invention, incorporating the clock distribution network 13, 33, 43 described above, may be used as part of a data processing system 900 shown in FIG. 5. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 901. PLD 10 may also be used as an arbiter for arbitrating access to a shared resources in system 900. In yet another example, PLD 10 can be configured as an interface between processor 901 and one of the other components in system 900. It should be noted that system 900 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. Multi-channel communication circuitry on an integrated circuit, said multi-channel communication circuitry comprising:
   a first number of blocks of communication circuitry;
   a second number of sources of signals for distribution to said blocks of communication circuitry;
   a plurality of conductor segments for distributing said signals from said sources to said blocks of communication circuitry, each block of communication circuitry being coupled to one of said conductor segments;
   a respective programmable connection between adjacent ones of said conductor segments; and
   a number of controllable input devices, each said controllable input devices selectably coupling one of said sources to one of said conductor segments.

2. The multi-channel communication circuitry of claim 1 wherein:
   each of said signals, from said sources, comprises a plurality of phases;
   each of said conductor segments comprises a plurality of signal conductors; and
   each respective one of said signal conductors is operable to carry a respective one of said phases of one of said signals.

3. The multi-channel communication circuitry of claim 2 wherein said phases are spaced apart by substantially equal phase angles.

4. The multi-channel communication circuitry of claim 3 wherein:
   said plurality of signal conductors comprises eight signal conductors; and
   said phases are separated by 45° of phase.

5. The multi-channel communication circuitry of claim 1 wherein said programmable connection comprises a tristatable buffer.

6. The multi-channel communication circuitry of claim 1 wherein said respective programmable connections are located at every fourth block.

7. The multi-channel communication circuitry of claim 1 wherein said respective programmable connections are located at every block.

8. The multi-channel communication circuitry of claim 1 wherein:

said plurality of conductor segments is arranged as a first portion comprising at least one segment and a second portion comprising at least one segment, a first one of said sources and a second one of said sources being located between said first and second portions; and said number of controllable input devices comprises:

a first multiplexer for selectably coupling one of said first one of said sources and said second one of said sources to said first portion, and a second multiplexer for selectably coupling one of said first one of said sources and said second one of said sources to said second portion.

9. The multi-channel communication circuitry of claim 8 wherein:

a third one of said sources is located at an end of said first portion remote from said second portion; and said number of controllable input devices further comprises a control element for selectably coupling said third one of said sources to said first portion.

10. The multi-channel communication circuitry of claim 9 wherein said control element for selectably coupling said third one of said sources to said first portion is tristatable.

11. The multi-channel communication circuitry of claim 10 wherein said control element for selectably coupling said third one of said sources to said first portion comprises a tristatable buffer.

12. The multi-channel communication circuitry of claim 10 wherein said control element for selectably coupling said third one of said sources to said first portion comprises a tristatable multiplexer.

13. The multi-channel communication circuitry of claim 9 wherein:

a fourth one of said sources is located at an end of said second portion remote from said first portion; and said number of controllable input devices further comprises a control element for selectably coupling said fourth one of said sources to said second portion.

14. The multi-channel communication circuitry of claim 13 wherein said control element for selectably coupling said fourth one of said sources to said second portion is tristatable.

15. The multi-channel communication circuitry of claim 14 wherein said control element for selectably coupling said fourth one of said sources to said second portion comprises a tristatable multiplexer.

16. An integrated circuit comprising the multi-channel communication circuitry of claim 1.

17. A digital processing system comprising:

processing circuitry;

a memory coupled to said processing circuitry; and an integrated circuit as defined in claim 16 coupled to the processing circuitry and the memory.

18. A printed circuit board on which is mounted an integrated circuit as defined in claim 16.

19. The printed circuit board defined in claim 18 further comprising:

memory circuitry mounted on the printed circuit board and coupled to the integrated circuit.

20. The printed circuit board defined in claim 19 further comprising:

processing circuitry mounted on the printed circuit board and coupled to the memory circuitry.

* * * * *

Disclaimer

8,072,260 B1 — Gregory Starr, San Jose, CA (US); Kang Wei Lai, Milpitas, CA (US); and Richard Y. Chang, Bloomfield, NJ (US). CONFIGURABLE CLOCK NETWORK FOR PROGRAMMABLE LOGIC DEVICE. Patent dated December 6, 2011. Disclaimer filed February 7, 2012, by the assignee, Altera Corporation.

The term of this patent shall not extend beyond the expiration date of Patent No. 7,286,007.

(*Official Gazette, March 27, 2012*)